United States Patent
Nodera et al.

(10) Patent No.: US 8,178,448 B2
(45) Date of Patent: May 15, 2012

(54) FILM FORMATION METHOD AND APPARATUS FOR SEMICONDUCTOR PROCESS

(75) Inventors: Nobutake Nodera, Nirasaki (JP); Masanobu Matsunaga, Nirasaki (JP); Kazuhide Hasebe, Nirasaki (JP); Koto Umezawa, Nirasaki (JP); Pao-Hwa Chou, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 109 days.

(21) Appl. No.: 12/852,094

(22) Filed: Aug. 6, 2010

(65) Prior Publication Data

US 2010/0304574 A1   Dec. 2, 2010

Related U.S. Application Data

(63) Continuation of application No. 12/155,678, filed on Jun. 6, 2008, now abandoned.

(30) Foreign Application Priority Data

Jun. 11, 2007 (JP) .................................. 2007-153735

(51) Int. Cl.
*H01L 21/31* (2006.01)

(52) U.S. Cl. ........ 438/792; 438/791; 427/578; 427/579; 257/E21.293

(58) Field of Classification Search .................. 438/791, 438/792; 427/578, 579; 257/E21.293
See application file for complete search history.

(56) References Cited

U.S. PATENT DOCUMENTS

| 5,874,368 | A | 2/1999 | Laxman et al. |
| 6,165,916 | A | 12/2000 | Muraoka et al. |
| 6,730,614 | B1 | 5/2004 | Lim et al. |
| 2006/0207504 | A1 | 9/2006 | Hasebe |
| 2006/0286817 | A1 | 12/2006 | Kato et al. |

FOREIGN PATENT DOCUMENTS

| CN | 1831192 A | 9/2006 |
| JP | 2-93071 | 4/1990 |
| JP | 6-45256 | 2/1994 |

OTHER PUBLICATIONS

Chinese Office Action issued on Oct. 12, 2010 for Chinese Application No. 200810142874.5 with English translation.
Yokoyama et al., "Atomic-layer selective deposition of silicon nitride on hydrogen-terminated Si surfaces", Applied Surface Science 130-132, 352-356, 1998.

*Primary Examiner* — Matthew Reames
(74) *Attorney, Agent, or Firm* — Smith, Gambrell & Russell, LLP

(57) ABSTRACT

Disclosed is a method for using a film formation apparatus to form a silicon nitride film by CVD on target substrates while suppressing particle generation. The apparatus includes a process container and an exciting mechanism attached on the process container. The method includes conducting a pre-coating process by performing pre-cycles and conducting a film formation process by performing main cycles. Each of the pre-cycles and main cycles alternately includes a step of supplying a silicon source gas and a step of supplying a nitriding gas with steps of exhausting gas from inside the process container interposed therebetween. The pre-coating process includes no period of exciting the nitriding gas by the exciting mechanism. The film formation process repeats a first cycle set that excites the nitriding gas by the exciting mechanism and a second cycle that does not excite the nitriding gas by the exciting mechanism.

16 Claims, 10 Drawing Sheets

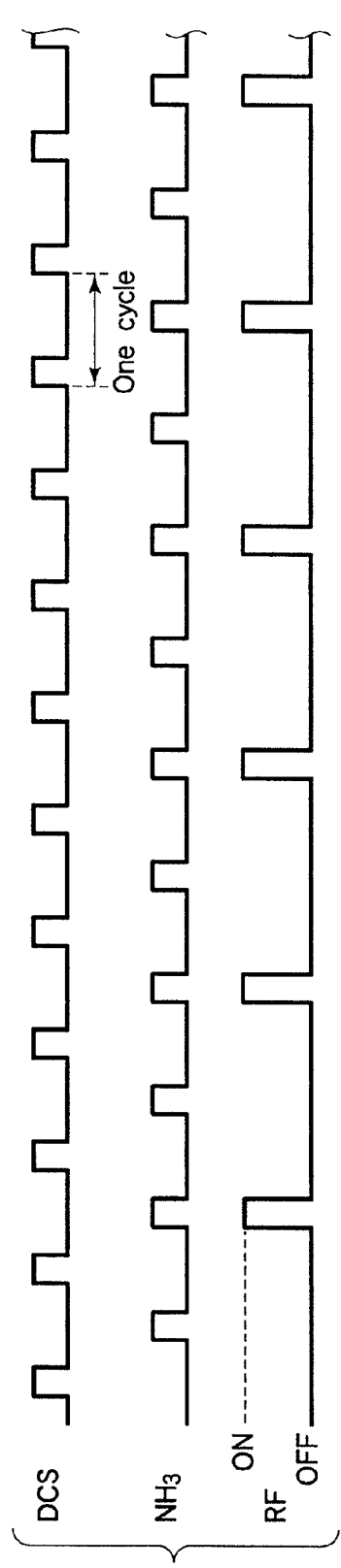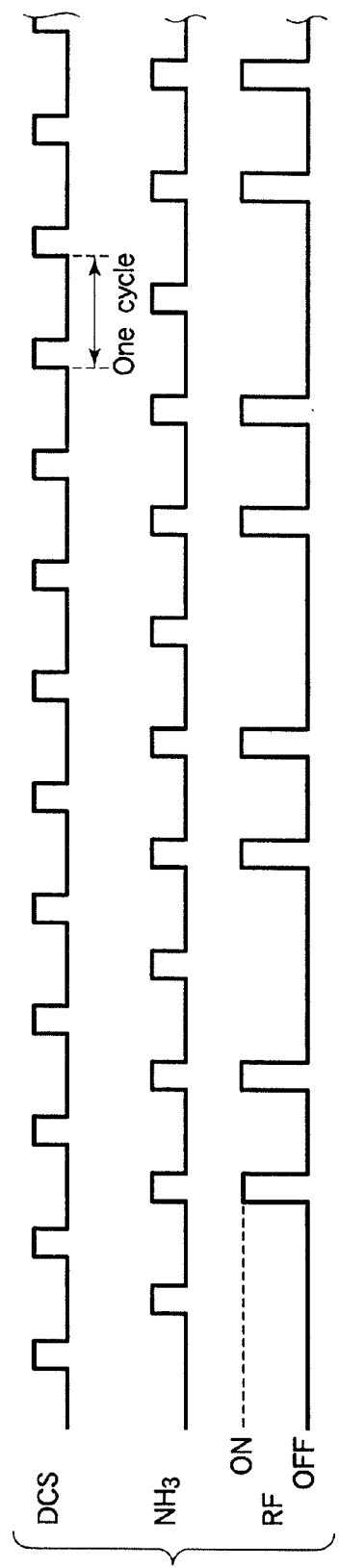

FILM FORMATION METHOD AND APPARATUS FOR SEMICONDUCTOR PROCESS

CROSS REFERENCE TO RELATED APPLICATION

This application is a continuation of Ser. No. 12/155,678, filed Jun. 6, 2008 and which is being incorporated in its entirety herein by reference.

BACKGROUND OF THE INVENTION

1. Field of the Invention

The present invention relates to a film formation method and apparatus for a semiconductor process for forming a silicon nitride film on a target substrate, such as a semiconductor wafer. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

In manufacturing semiconductor devices for constituting semiconductor integrated circuits, a target substrate, such as a semiconductor wafer, is subjected to various processes, such as film formation, etching, oxidation, diffusion, reformation, annealing, and natural oxide film removal. US 2006/0286817 A1 discloses a semiconductor processing method of this kind performed in a vertical heat-processing apparatus (of the so-called batch type). According to this method, semiconductor wafers are first transferred from a wafer cassette onto a vertical wafer boat and supported thereon at intervals in the vertical direction. The wafer cassette can store, e.g., 25 wafers, while the wafer boat can support 30 to 150 wafers. Then, the wafer boat is loaded into a process container from below, and the process container is airtightly closed. Then, a predetermined heat process is performed, while the process conditions, such as process gas flow rate, process pressure, and process temperature, are controlled.

In order to improve the performance of semiconductor integrated circuits, it is important to improve properties of insulating films used in semiconductor devices. Semiconductor devices include insulating films made of materials, such as $SiO_2$, PSG (Phospho Silicate Glass), P—SiO (formed by plasma CVD), P—SiN (formed by plasma CVD), and SOG (Spin On Glass), $Si_3N_4$ (silicon nitride). Particularly, silicon nitride films are widely used, because they have better insulation properties as compared to silicon oxide films, and they can sufficiently serve as etching stopper films or inter-level insulating films. Further, for the same reason, carbon nitride films doped with boron are sometimes used.

Several methods are known for forming a silicon nitride film on the surface of a semiconductor wafer by thermal CVD (Chemical Vapor Deposition). In such thermal CVD, a silane family gas, such as monosilane ($SiH_4$), dichlorosilane (DCS: $SiH_2Cl_2$), hexachlorodisilane (HCD: $Si_2Cl_6$), bistertialbutylaminosilane (BTBAS: $SiH_2(NH(C_4H_9))_2$), or $(t-C_4H_9NH)_2SiH_2$, is used as a silicon source gas. For example, a silicon nitride film is formed by thermal CVD using a gas combination of $SiH_2Cl_2+NH_3$ (see U.S. Pat. No. 5,874,368 A) or $Si_2Cl_6+NH_3$. Further, there is also proposed a method for doping a silicon nitride film with an impurity, such as boron (B), to decrease the dielectric constant.

In recent years, owing to the demands of increased miniaturization and integration of semiconductor integrated circuits, it is required to alleviate the thermal history of semiconductor devices in manufacturing steps, thereby improving the characteristics of the devices. For vertical processing apparatuses, it is also required to improve semiconductor processing methods in accordance with the demands described above. For example, there is a CVD (Chemical Vapor Deposition) method for a film formation process, which performs film formation while intermittently supplying a source gas and so forth to repeatedly form layers each having an atomic or molecular level thickness, one by one, or several by several (for example, Jpn. Pat. Appln. KOKAI Publications No. 2-93071 and No. 6-45256 and U.S. Pat. No. 6,165,916 A). In general, this film formation method is called ALD (Atomic layer Deposition) or MLD (Molecular Layer Deposition), which allows a predetermined process to be performed without exposing wafers to a very high temperature.

For example, where dichlorosilane (DCS) and $NH_3$ are supplied as a silane family gas and a nitriding gas, respectively, to form a silicon nitride film (SiN), the process is performed, as follows. Specifically, DCS and $NH_3$ gas are alternately and intermittently supplied into a process container with purge periods interposed therebetween. When $NH_3$ gas is supplied, an RF (radio frequency) is applied to generate plasma within the process container so as to promote a nitridation reaction. More specifically, when DCS is supplied into the process container, a layer with a thickness of one molecule or more of DCS is adsorbed onto the surface of wafers. The superfluous DCS is removed during the purge period. Then, $NH_3$ is supplied and plasma is generated, thereby performing low temperature nitridation to form a silicon nitride film. These sequential steps are repeated to complete a film having a predetermined thickness.

BRIEF SUMMARY OF THE INVENTION

An object of the present invention is to provide a film formation method and apparatus for a semiconductor process, which can form a silicon nitride film of high quality at a high film formation rate while preventing particle generation.

According to a first aspect of the present invention, there is provided a film formation method for a semiconductor process for forming a silicon nitride film on a target substrate, in a process field inside a process container configured to be selectively supplied with a first process gas containing a silane family gas and a second process gas containing a nitriding gas, and communicating with an exciting mechanism for exciting the second process gas to be supplied, the method comprising a film formation process arranged to perform a plurality of cycles in the process field with the target substrate placed therein to laminate thin films respectively formed by the cycles on the target substrate, thereby forming a silicon nitride film with a predetermined thickness, each of the cycles comprising: a first supply step of performing supply of the first process gas to the process field while maintaining a shut-off state of supply of the second process gas to the process field; and a second supply step of performing supply of the second process gas to the process field while maintaining a shut-off state of supply of the first process gas to the process field, wherein the method is arranged to repeat a first cycle set and a second cycle set mixedly a plurality of times without an essential change in a heating temperature set to the process field: the first cycle set being composed of a cycle or cycles in which the second supply step comprises an excitation period of supplying the second process gas to the process field while exciting the second process gas by the exciting mechanism; and the second cycle set being composed of a cycle or cycles in which the second supply step comprises no period of exciting the second process gas by the exciting mechanism.

According to a second aspect of the present invention, there is provided a film formation apparatus for a semiconductor process, comprising: a process container having a process field configured to accommodate a target substrate; a support member configured to support the target substrate inside the process field; a heater configured to heat the target substrate inside the process field; an exhaust system configured to exhaust gas from the process field; a first process gas supply circuit configured to supply a first process gas containing a silane family gas to the process field; a second process gas supply circuit configured to supply a second process gas containing a nitriding gas to the process field; an exciting mechanism configured to excite the second process gas to be supplied; and a control section configured to control an operation of the apparatus, wherein the control section is preset to execute a film formation method for a semiconductor process for forming a silicon nitride film on the target substrate, the method comprising a film formation process arranged to perform a plurality of cycles in the process field with the target substrate placed therein to laminate thin films respectively formed by the cycles on the target substrate, thereby forming a silicon nitride film with a predetermined thickness, each of the cycles comprising: a first supply step of performing supply of the first process gas to the process field while maintaining a shut-off state of supply of the second process gas to the process field; and a second supply step of performing supply of the second process gas to the process field while maintaining a shut-off state of supply of the first process gas to the process field, wherein the method is arranged to repeat a first cycle set and a second cycle set mixedly a plurality of times without an essential change in a heating temperature set to the process field: the first cycle set being composed of a cycle or cycles in which the second supply step comprises an excitation period of supplying the second process gas to the process field while exciting the second process gas by the exciting mechanism; and the second cycle set being composed of a cycle or cycles in which the second supply step comprises no period of exciting the second process gas by the exciting mechanism.

According to a third aspect of the present invention, there is provided a computer readable medium containing program instructions for execution on a processor, which is used for a film formation apparatus for a semiconductor process for forming a silicon nitride film on a target substrate, in a process field inside a process container configured to be selectively supplied with a first process gas containing a silane family gas and a second process gas containing a nitriding gas, and communicating with an exciting mechanism for exciting the second process gas to be supplied, wherein the program instructions, when executed by the processor, cause the film formation apparatus to conduct a film formation method comprising a film formation process arranged to perform a plurality of cycles in the process field with the target substrate placed therein to laminate thin films respectively formed by the cycles on the target substrate, thereby forming a silicon nitride film with a predetermined thickness, each of the cycles comprising: a first supply step of performing supply of the first process gas to the process field while maintaining a shut-off state of supply of the second process gas to the process field; and a second supply step of performing supply of the second process gas to the process field while maintaining a shut-off state of supply of the first process gas to the process field, wherein the method is arranged to repeat a first cycle set and a second cycle set mixedly a plurality of times without an essential change in a heating temperature set to the process field: the first cycle set being composed of a cycle or cycles in which the second supply step comprises an excitation period of supplying the second process gas to the process field while exciting the second process gas by the exciting mechanism; and the second cycle set being composed of a cycle or cycles in which the second supply step comprises no period of exciting the second process gas by the exciting mechanism.

In the first to third aspects, before forming the silicon nitride film on the target substrate, the method may further comprise a pre-coating process arranged to perform a plurality of pre-cycles in the process container with no target substrate placed therein to form a pre-coating film inside the process container, each of the pre-cycles comprising: a first pre-step of performing supply of the first process gas into the process container while maintaining a shut-off state of supply of the second process gas into the process container; and a second pre-step of performing supply of the second process gas into the process container while maintaining a shut-off state of supply of the first process gas into the process container, wherein the second pre-step comprises no period of exciting the second process gas by the exciting mechanism.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 11A and 11B are timing charts each showing the gas supply and RF (radio frequency) application of a film formation method according to a modification of the present invention.

DETAILED DESCRIPTION OF THE INVENTION

Figure 1:
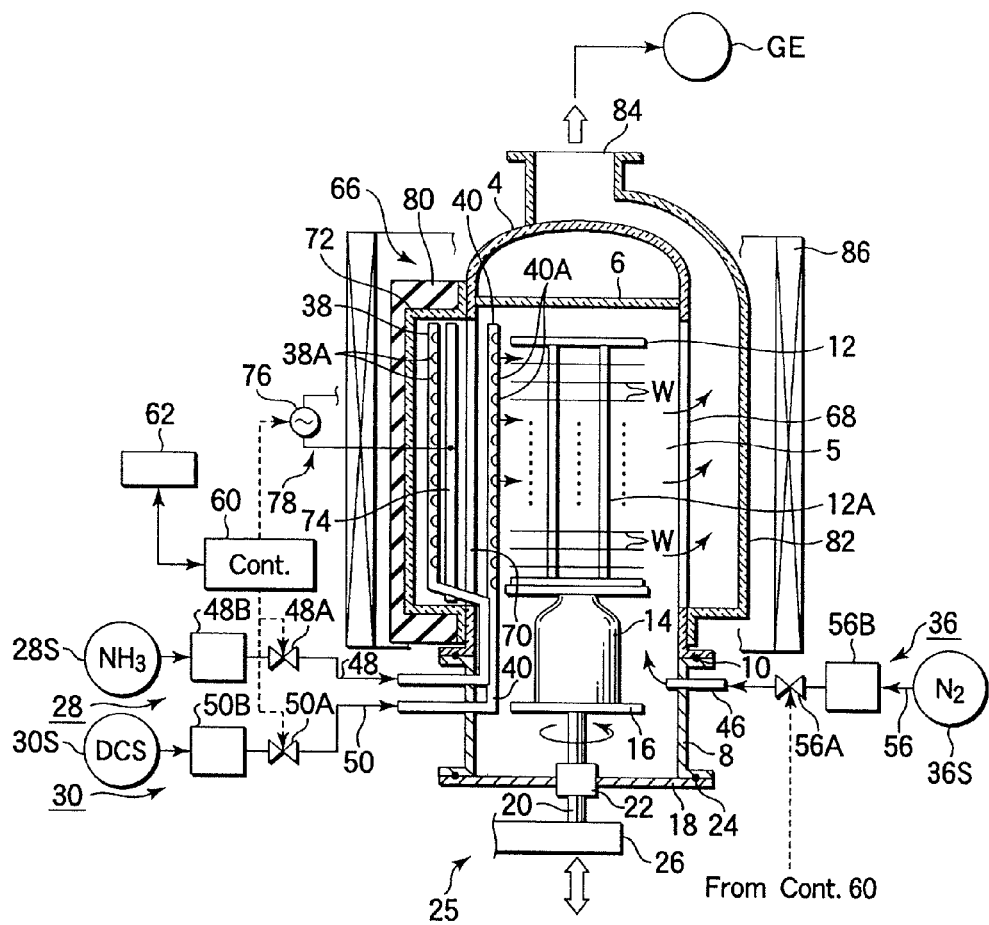
FIG. 1 is a sectional view showing a film formation apparatus (vertical CVD apparatus) according to an embodiment of the present invention.

In the process of developing the present invention, the inventors studied problems of conventional techniques for semiconductor processes, in relation to methods for forming a silicon nitride film. As a result, the inventors have arrived at the findings given below.

Specifically, as described previously, there is a conventional technique arranged to utilize so-called ALD or MLD film formation and to generate plasma by use of radio frequency (RF) when supplying $NH_3$ gas as a nitriding gas, thereby promoting the nitridation reaction. As compared to a process performed without plasma, this process can improve not only the film formation rate (film formation speed), but also the quality of the deposited silicon nitride film to a large extent. However, it has been confirmed that, where plasma generation is used, particle generation inside the process container is increased due to an increase in the stress of the deposited silicon nitride film and so forth.

In this respect, it has been found that, where ALD or MLD film formation is performed such that cycle sets excluding plasma generation in supplying a nitriding gas are mixed with cycle sets including plasma generation in supplying a nitriding gas, the particle generation can be suppressed. Accordingly, where a suitable mixture manner of cycle sets is selected in accordance with this concept, a silicon nitride film of high quality can be formed at a high film formation rate while preventing particle generation. In addition, where a pre-coating process is performed inside the process container by use of cycle sets excluding plasma generation in supplying a nitriding gas, before the film formation process, the effect described above is further improved.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 2:
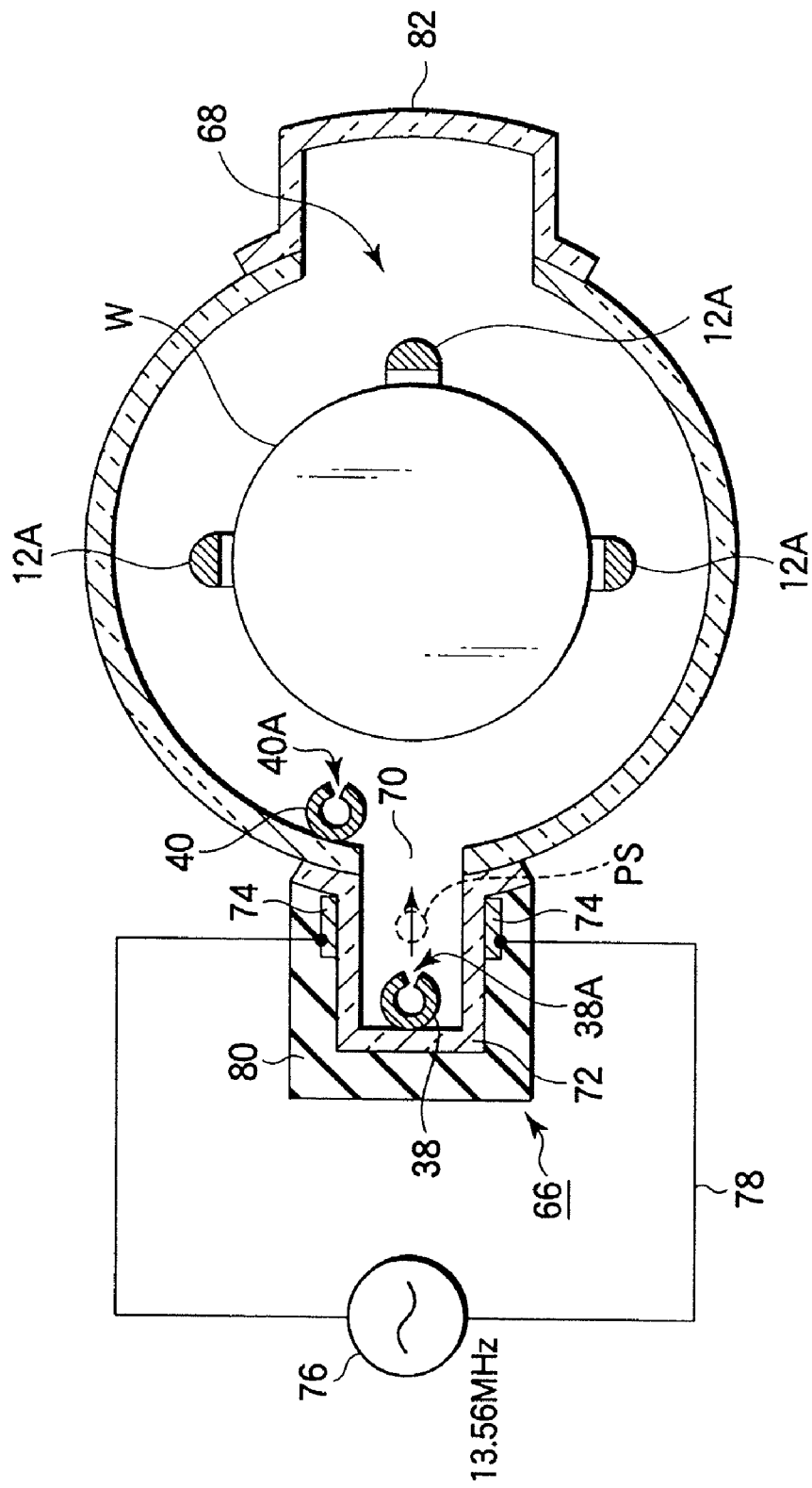
FIG. 2 is a sectional plan view showing part of the apparatus shown in FIG. 1.

FIG. 1 is a sectional view showing a film formation apparatus (vertical CVD apparatus) according to an embodiment of the present invention. FIG. 2 is a sectional plan view showing part of the apparatus shown in FIG. 1. The film formation apparatus 2 has a process field configured to be selectively supplied with a first process gas containing dichlorosilane (DCS) gas as a silane family gas, and a second process gas containing ammonia ($NH_3$) gas as a nitriding gas. The film formation apparatus 2 is configured to form a silicon nitride film on target substrates in the process field.

The apparatus 2 includes a process container 4 shaped as a cylindrical column with a ceiling and an opened bottom, in which a process field 5 is defined to accommodate and process a plurality of semiconductor wafers (target substrates) stacked at intervals in the vertical direction. The entirety of the process container 4 is made of, e.g., quartz. The top of the process container 4 is provided with a quartz ceiling plate 6 to airtightly seal the top. The bottom of the process container 4 is connected through a seal member 10, such as an O-ring, to a cylindrical manifold 8. The process container may be entirely formed of a cylindrical quartz column without a manifold 8 separately formed.

The manifold 8 is made of, e.g., stainless steel, and supports the bottom of the process container 4. A wafer boat 12 made of quartz is moved up and down through the bottom port of the manifold 8, so that the wafer boat 12 is loaded/unloaded into and from the process container 4. A number of target substrates or semiconductor wafers W are stacked on a wafer boat 12. For example, in this embodiment, the wafer boat 12 has struts 12A that can support, e.g., about 50 to 100 wafers having a diameter of 300 mm at essentially regular intervals in the vertical direction.

The wafer boat 12 is placed on a table 16 through a heat-insulating cylinder 14 made of quartz. The table 16 is supported by a rotary shaft 20, which penetrates a lid 18 made of, e.g., stainless steel, and is used for opening/closing the bottom port of the manifold 8.

The portion of the lid 18 where the rotary shaft 20 penetrates is provided with, e.g., a magnetic-fluid seal 22, so that the rotary shaft 20 is rotatably supported in an airtightly sealed state. A seal member 24, such as an O-ring, is interposed between the periphery of the lid 18 and the bottom of the manifold 8, so that the interior of the process container 4 can be kept sealed.

The rotary shaft 20 is attached at the distal end of an arm 26 supported by an elevating mechanism 25, such as a boat elevator. The elevating mechanism 25 moves the wafer boat 12 and lid 18 up and down integratedly. The table 16 may be fixed to the lid 18, so that wafers W are processed without rotation of the wafer boat 12.

A gas supply section is connected to the side of the manifold 8 to supply predetermined process gases to the process field 5 within the process container 4. Specifically, the gas supply section includes a second process gas supply circuit 28, a first process gas supply circuit 30, and a purge gas supply circuit 36. The first process gas supply circuit 30 is arranged to supply a first process gas containing a silane family gas, such as DCS (dichlorosilane) gas. The second process gas supply circuit 28 is arranged to supply a second process gas containing a nitriding gas, such as ammonia ($NH_3$) gas. The purge gas supply circuit 36 is arranged to supply an inactive gas, such as $N_2$ gas, as a purge gas. Each of the first and second process gases is mixed with a suitable amount of carrier gas, as needed. However, such a carrier gas will not be mentioned, hereinafter, for the sake of simplicity of explanation.

More specifically, the second and first process gas supply circuits 28 and 30 include gas distribution nozzles 38 and 40, respectively, each of which is formed of a quartz pipe which penetrates the sidewall of the manifold 8 from the outside and then turns and extends upward (see FIG. 1). The gas distribution nozzles 38 and 40 respectively have a plurality of gas spouting holes 38A and 40A, each set of holes being formed at predetermined intervals in the longitudinal direction (the vertical direction) over all the wafers W on the wafer boat 12. Each of the gas spouting holes 38A and 40A delivers the corresponding process gas almost uniformly in the horizontal direction, so as to form gas flows parallel with the wafers W on the wafer boat 12. The purge gas supply circuit 36 includes a short gas nozzle 46, which penetrates the sidewall of the manifold 8 from the outside.

The nozzles 38, 40, and 46 are connected to gas sources 28S, 30S, and 36S of $NH_3$ gas, DCS gas, and $N_2$ gas, respectively, through gas supply lines (gas passages) 48, 50, and 56, respectively. The gas supply lines 48, 50, and 56 are provided with switching valves 48A, 50A, and 56A and flow rate controllers 48B, 50B, and 56B, such as mass flow controllers, respectively. With this arrangement, $NH_3$ gas, DCS gas, and $N_2$ gas can be supplied at controlled flow rates.

A gas exciting section 66 is formed at the sidewall of the process container 4 in the vertical direction. On the side of the process container 4 opposite to the gas exciting section 66, a long and thin exhaust port 68 for vacuum-exhausting the inner atmosphere is formed by cutting the sidewall of the process container 4 in, e.g., the vertical direction.

Specifically, the gas exciting section 66 has a vertically long and thin opening 70 formed by cutting a predetermined width of the sidewall of the process container 4, in the vertical direction. The opening 70 is covered with a quartz cover 72 airtightly connected to the outer surface of the process container 4 by welding. The cover 72 has a vertical long and thin shape with a concave cross-section, so that it projects outward from the process container 4.

With this arrangement, the gas exciting section 66 is formed such that it projects outward from the sidewall of the process container 4 and is opened on the other side to the interior of the process container 4. In other words, the inner space of the gas exciting section 66 communicates with the process field 5 within the process container 4. The opening 70 has a vertical length sufficient to cover all the wafers W on the wafer boat 12 in the vertical direction.

A pair of long and thin electrodes 74 are disposed on the opposite outer surfaces of the cover 72, and face each other in the longitudinal direction (the vertical direction). The electrodes 74 are connected to an RF (Radio Frequency) power supply 76 for plasma generation, through feed lines 78. An RF voltage of, e.g., 13.56 MHz is applied to the electrodes 74 to form an RF electric field for exciting plasma between the electrodes 74. The frequency of the RF voltage is not limited to 13.56 MHz, and it may be set at another frequency, e.g., 400 kHz.

The gas distribution nozzle 38 of the second process gas is bent outward in the radial direction of the process container 4, at a position lower than the lowermost wafer W on the wafer boat 12. Then, the gas distribution nozzle 38 vertically extends at the deepest position (the farthest position from the center of the process container 4) in the gas exciting section 66. As shown also in FIG. 2, the gas distribution nozzle 38 is separated outward from an area sandwiched between the pair of electrodes 74 (a position where the RF electric field is most intense), i.e., a plasma generation area PS where the main plasma is actually generated. The second process gas containing $NH_3$ gas is spouted from the gas spouting holes 38A of the gas distribution nozzle 38 toward the plasma generation area PS. Then, the second process gas is selectively excited (decomposed or activated) in the plasma generation area PS, and is supplied in this state onto the wafers W on the wafer boat 12.

An insulating protection cover 80 made of, e.g., quartz is attached on and covers the outer surface of the cover 72. A cooling mechanism (not shown) is disposed in the insulating protection cover 80 and comprises coolant passages respectively facing the electrodes 74. The coolant passages are supplied with a coolant, such as cooled nitrogen gas, to cool the electrodes 74. The insulating protection cover 80 is covered with a shield (not shown) disposed on the outer surface to prevent RF leakage.

At a position near and outside the opening 70 of the gas exciting section 66, the gas distribution nozzle 40 of the first process gas is disposed. Specifically, the gas distribution nozzle 40 extends upward on one side of the outside of the opening 70 (in the process container 4). The first process gas containing DCS gas is spouted from the gas spouting holes 40A of the gas distribution nozzle 40 toward the center of the process container 4.

On the other hand, the exhaust port 68, which is formed opposite the gas exciting section 66, is covered with an exhaust port cover member 82. The exhaust port cover member 82 is made of quartz with a U-shape cross-section, and attached by welding. The exhaust cover member 82 extends upward along the sidewall of the process container 4, and has a gas outlet 84 at the top of the process container 4. The gas outlet 84 is connected to a vacuum-exhaust system GE including a vacuum pump and so forth.

The process container 4 is surrounded by a heater 86, which is used for heating the atmosphere within the process container 4 and the wafers W. A thermocouple (not shown) is disposed near the exhaust port 68 in the process container 4 to control the heater 86.

The film formation apparatus 2 further includes a main control section 60 formed of, e.g., a computer, to control the entire apparatus. The main control section 60 can control the film formation process and pre-coating process described below in accordance with process recipes stored in the storage section 62 thereof in advance, with reference to the film thickness and composition of a film to be formed. In the storage section 62, the relationship between the process gas flow rates and the thickness and composition of the film is also stored as control data in advance. Accordingly, the main control section 60 can control the elevating mechanism 25, gas supply circuits 28, 30, and 36, exhaust system GE, gas exciting section 66, heater 86, and so forth, based on the stored process recipes and control data. Examples of a storage medium are a magnetic disk (flexible disk, hard disk (a representative of which is a hard disk included in the storage section 62), etc.), an optical disk (CD, DVD, etc.), a magneto-optical disk (MO, etc.), and a semiconductor memory.

Next, an explanation will be given of a film formation method (so called ALD or MLD film formation) performed in the apparatus shown in FIG. 1. In this film formation method, a silicon nitride film is formed on semiconductor wafers by ALD or MLD. In order to achieve this, a first process gas containing dichlorosilane (DCS) gas as a silane family gas and a second process gas containing ammonia ($NH_3$) gas as a nitriding gas are selectively supplied into the process field 5 accommodating wafers W. Specifically, a film formation process is performed along with the following operations.

<Film Formation Process>

At first, the wafer boat 12 at room temperature, which supports a number of, e.g., 50 to 100, wafers having a diameter of 300 mm, is loaded into the process container 4 heated at a predetermined temperature, and the process container 4 is airtightly closed. Then, the interior of the process container 4 is vacuum-exhausted and kept at a predetermined process pressure, and the wafer temperature is increased to a process temperature for film formation. At this time, the apparatus is in a waiting state until the temperature becomes stable. Then, while the wafer boat 12 is rotated, the first and second process gases are intermittently supplied from the respective gas distribution nozzles 40 and 38 at controlled flow rates.

The first process gas containing DCS gas is supplied from the gas spouting holes 40A of the gas distribution nozzle 40 to form gas flows parallel with the wafers W on the wafer boat 12. While being supplied, the DCS gas is activated by the heating temperature to the process field 5, and molecules of the DCS gas and molecules and atoms of decomposition products generated by decomposition are adsorbed on the wafers W.

On the other hand, the second process gas containing $NH_3$ gas is supplied from the gas spouting holes 38A of the gas distribution nozzle 38 to form gas flows parallel with the wafers W on the wafer boat 12. When the second process gas is supplied, the gas exciting section 66 is set in the ON-state or OFF-state, depending on the cycle sets, as described later.

When the gas exciting section 66 is set in the ON-state, the second process gas is excited and partly turned into plasma when it passes through the plasma generation area PS between the pair of electrodes 74. At this time, for example, radicals (activated species), such as $N^*$, $NH^*$, $NH_2^*$, and $NH_3^*$, are produced (the symbol [*] denotes that it is a radical). On the other hand, when the gas exciting section 66 is set in the OFF-state, the second process gas passes, mainly as gas molecules, through the gas exciting section 66. The radicals or gas molecules flow out from the opening 70 of the gas exciting section 66 toward the center of the process container 4, and are supplied into gaps between the wafers W in a laminar flow state.

Radicals derived from the $NH_3$ gas excited by plasma or molecules of the $NH_3$ gas and molecules and atoms of decomposition products generated by decomposition due to activation by the heating temperature to the process field 5 react with molecules and so forth of DCS gas adsorbed on the surface of the wafers W, so that a thin film is formed on the wafers W. Alternatively, when the DCS gas flows onto radicals derived from the $NH_3$ gas or molecules and atoms of decomposition products derived from the $NH_3$ gas and adsorbed on the surface of the wafers W, the same reaction is caused, so a silicon nitride film is formed on the wafers W. When the gas exciting section 66 is set in the ON-state, the film formation is developed at an increased reaction rate. On the other hand, when the gas exciting section 66 is set in the OFF-state, the film formation is developed at a decreased reaction rate.

Figure 3:
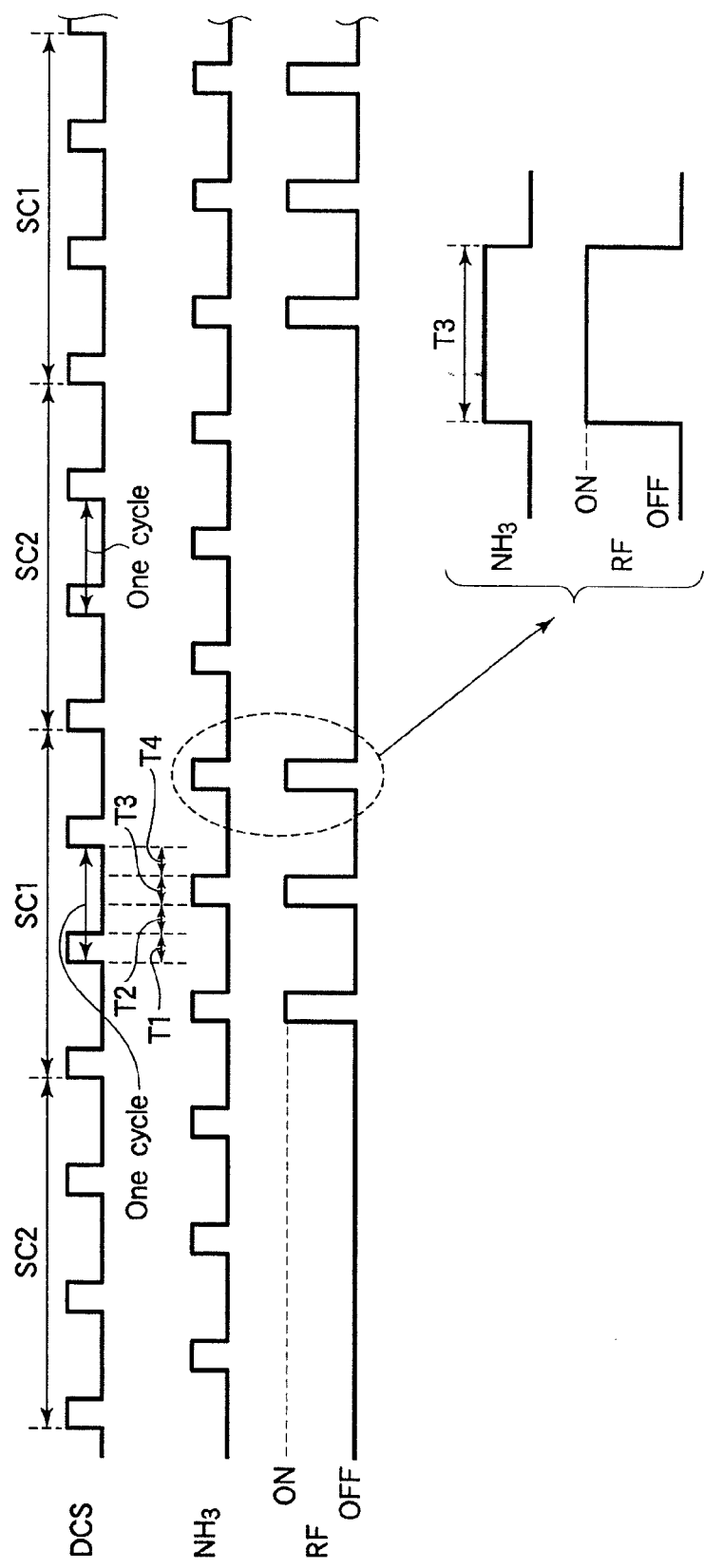
FIG. 3 is a timing chart showing the gas supply and RF (radio frequency) application of a film formation method according to an embodiment of the present invention.

FIG. 3 is a timing chart showing the gas supply and RF (radio frequency) application of a film formation method according to an embodiment of the present invention. As shown in FIG. 3, the film formation method according to this embodiment repeats a first cycle set SC1 and a second cycle set SC2 mixedly, such as alternately as in this example, a plurality of times. The first cycle set SC1 is composed of a cycle or cycles in which the second process gas containing $NH_3$ gas is excited by the gas exciting section 66. The second cycle set SC2 is composed of a cycle or cycles in which the second process gas is not excited by the gas exciting section 66. Each of the first and second cycle sets SC1 and SC2 is formed of a set of three cycles, and each of the cycles is formed of first to fourth steps T1 to T4. Accordingly, a cycle comprising the first to fourth steps T1 to T4 is repeated a number of times, and thin films of silicon nitride formed by respective cycles are laminated, thereby arriving at a silicon nitride film having a target thickness.

Specifically, the first step T1 is arranged to perform supply of the first process gas (denoted as DCS in FIG. 3) to the process field 5, while maintaining the shut-off state of supply of the second process gas (denoted as $NH_3$ in FIG. 3) to the process field 5. The second step T2 is arranged to maintain the shut-off state of supply of the first and second process gases to the process field 5. The third step T3 is arranged to perform supply of the second process gas to the process field 5, while maintaining the shut-off state of supply of the first process gas to the process field 5. The fourth step T4 is arranged to maintain the shut-off state of supply of the first and second process gases to the process field 5.

Each of the second and fourth steps T2 and T4 is used as a purge step to remove the residual gas within the process container 4. The term "purge" means removal of the residual gas within the process container 4 by vacuum-exhausting the interior of the process container 4 while supplying an inactive gas, such as $N_2$ gas, into the process container 4, or by vacuum-exhausting the interior of the process container 4 while maintaining the shut-off state of supply of all the gases. In this respect, the second and fourth steps T2 and T4 may be arranged such that the first half utilizes only vacuum-exhaust and the second half utilizes both vacuum-exhaust and inactive gas supply. Further, the first and third steps T1 and T3 may be arranged to stop vacuum-exhausting the process container 4 while supplying each of the first and second process gases. However, where supplying each of the first and second process gases is performed along with vacuum-exhausting the process container 4, the interior of the process container 4 can be continuously vacuum-exhausted over the entirety of the first to fourth steps T1 to T4.

In the third step T3 of the first cycle set SC1, the RF power supply 76 is set in the ON-state to turn the second process gas into plasma by the gas exciting section 66, so as to supply the second process gas in an activated state to the process field 5. In the third step T3 of the second cycle set SC2, the RF power supply 76 is set in the OFF-state not to turn the second process gas into plasma by the gas exciting section 66, while supplying the second process gas to the process field 5. However, the heating temperature set by the heater 86 to the process field 5 remains the same in the first and second cycle sets SC1 and SC2, i.e., it is essentially not changed depending on the cycle sets.

In FIG. 3, the first step T1 is set to be within a range of about 2 to 10 seconds, the second step T2 is set to be within a range of about 5 to 15 seconds, the third step T3 is set to be within a range of about 10 to 20 seconds, and the fourth step T4 is set to be within a range of about 5 to 15 seconds. As an average value provided by the first and second cycle sets SC1 and SC2, the film thickness obtained by one cycle of the first to fourth steps T1 to T4 is about 0.11 to 0.13 nm. Accordingly, for example, where the target film thickness is 50 nm, the cycle is repeated about 450 times (=150 cycle sets). However, these values of time and thickness are merely examples and thus are not limiting.

Figure 4:
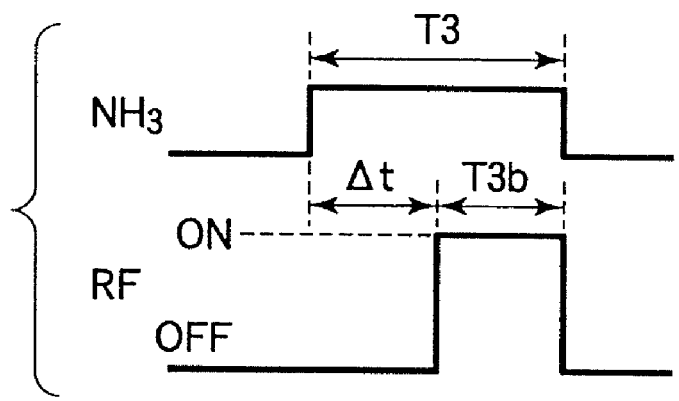
FIG. 4 is a view showing a modification concerning the ON-state of an RF power supply in the $NH_3$ gas supply step.

FIG. 4 is a view showing a modification concerning the ON-state of an RF power supply in the $NH_3$ gas supply step. In this modification, halfway through the third step T3, the RF power supply 76 is set in the ON-state to supply the second process gas in an activated state to the process field 5 during a sub-step T3b. Specifically, in the third step T3, the RF power supply 76 is turned on after a predetermined time $\Delta t$ passes, to turn the second process gas into plasma by the gas exciting section 66, so as to supply the second process gas in an activated state to the process field 5 during the sub-step T3b. The predetermined time $\Delta t$ is defined as the time necessary for stabilizing the flow rate of $NH_3$ gas, which is set at, e.g., about 5 seconds. Since the RF power supply is turned on to generate plasma after the flow rate of the second process gas is stabilized, the uniformity of radical concentration among the wafers W (uniformity in the vertical direction) is improved.

Figure 5:
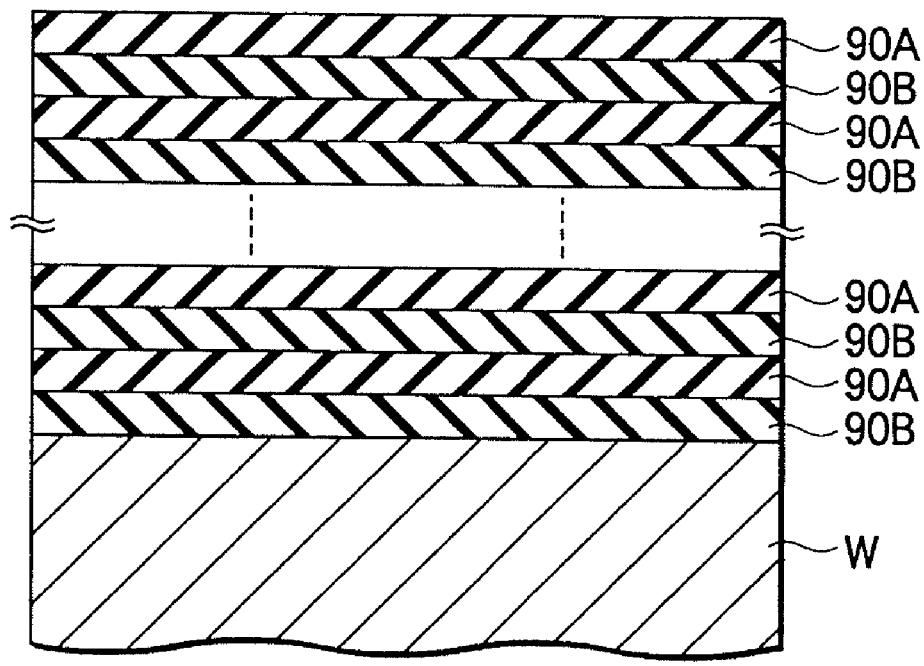
FIG. 5 is a sectional view showing the laminated state of a silicon nitride film formed by use of the timing chart shown in FIG. 3.

FIG. 5 is a sectional view showing the laminated state of a silicon nitride film formed by use of the timing chart shown in FIG. 3. As shown in FIG. 5, SiN regions 90A formed by use of no plasma and SiN regions 90B formed by use of plasma are alternately laminated on the surface of a wafer W. In the case of the timing chart shown in FIG. 3, each of the SiN regions 90A and 90B is formed of three unit thin films corresponding to three cycles.

Where the film formation method described above is used, particle generation is decreased to the minimum, and a silicon nitride film thereby formed is provided with film quality, as a whole, equivalent to that of a film formed by use of plasma in all the $NH_3$ gas supply steps. Specifically, it is possible to greatly decrease the dielectric constant of the deposited silicon nitride film, and to greatly improve the etching resistance of the film in dry etching. For example, even where the film formation temperature is set at, e.g., 550° C., which is lower than the conventional film formation temperature of, e.g., about 760° C., it is possible to decrease the etching rate of the film relative to dilute hydrofluoric acid used in a cleaning process or etching process performed on the surface of the film. As a result, the film is not excessively etched by cleaning, and thus the cleaning process is performed with high controllability in the film thickness. Further, the film can sufficiently serve as an etching stopper film or inter-level insulating film.

The process conditions of the film formation process are as follows. The flow rate of DCS gas is set to be within a range of 50 to 2,000 sccm, e.g., at 1,000 sccm (1 slm). The flow rate of $NH_3$ gas is set to be within a range of 500 to 5,000 sccm, e.g., at 1,000 sccm. The process temperature is lower than ordinary CVD processes, and is set to be within a range of 300 to 700° C., and preferably of 450 to 630° C. If the process temperature is lower than 300° C., essentially no film is deposited because hardly any reaction is caused. If the process temperature is higher than 700° C., a low quality CVD film is deposited, and existing films, such as a metal film, suffer thermal damage. The temperature of the process field 5 may be changed to some extent depending on the presence and absence of plasma in the first and second cycle sets SC1 and SC2. However, the heating temperature set by the heater 86 to the process field 5 remains essentially the same in the first and second cycle sets SC1 and SC2.

The process pressure is set to be within a range of 13 Pa (0.1 Torr) to 13,300 Pa (100 Torr), preferably of 40 Pa (0.3 Torr) to 266 Pa (2 Torr), and more preferably of 93 P (0.7 Torr) to 107 P (0.8 Torr). For example, the process pressure is set at 1 Torr during the first step (DCS supply step) T1, and at 0.3 Torr during the third step ($NH_3$ supply step) T3. If the process pressure is lower than 13 Pa, the film formation rate becomes lower than the practical level. Where the process pressure does not exceed 13,300 Pa, the reaction mode on the wafers W is mainly of an adsorption reaction, and thus a high quality thin film can be stably deposited at a high film formation rate, thereby attaining a good result. However, if the process pressure exceeds 13,300 Pa, the reaction mode is shifted from the adsorption reaction to a vapor-phase reaction, which then becomes prevailing on the wafers W. This is undesirable, because the inter-substrate uniformity and planar uniformity of the film are deteriorated, and the number of particles due to the vapor-phase reaction suddenly increases.

The number of cycles constituting each of the first and second cycle sets SC1 and SC2 is not limited to three, and one cycle set may be defined by, e.g., one to ten cycles. In FIG. 3, the second cycle set SC2 is first performed, but the first cycle set SC1 may be first performed. In FIG. 3, DCS is first supplied in each cycle, but $NH_3$ gas may be first supplied alternatively. The mixture state of the first and second cycle sets SC1 and SC2 does not have to be completely constant, but may be random. However, in light of controllability, this mixture state is preferably set constant (alternate state).

The number of cycles constituting the first cycle set SC1 is preferably set to be larger than the number of cycles constituting the second cycle set SC2. If the second cycle set SC2 utilizing no plasma has an excessively large number of constituting cycles, or the second cycle set SC2 is performed with an excessively large frequency, the film quality is deteriorated. In reverse, if these factors are excessively small, particle generation is rapidly increased. For example, the first cycle set SC1 utilizing plasma may be formed of three cycles, four cycles, or a larger number of cycles, while the second cycle set SC2 utilizing no plasma may be formed of only one cycle or two cycles.

FIGS. 11A and 11B are timing charts each showing the gas supply and RF (radio frequency) application of a film formation method according to a modification of the present invention. In the modification shown in FIG. 11A, each of the first and second cycle sets SC1 and SC2 is formed of one cycle, and the first and second cycle sets SC1 and SC2 are alternately performed. In the modification shown in FIG. 11B, the first cycle set SC1 is formed of two cycles, the second cycle set SC2 is formed of one cycle, and the first and second cycle sets SC1 and SC2 are alternately performed.

<Experiment>

As present examples PE1, PE2, and PE3 according to the embodiment described above and comparative examples CE1 and CE2, a silicon nitride film was formed in the apparatus shown in FIG. 1 by film formation methods respectively using different combinations of cycle sets performed with plasma and cycle sets performed without plasma, and then the film thus formed was examined. In this experiment, the process conditions described above were employed as the reference for the film formation process, while the film formation temperature was set at 550° C. and the target film thickness was set at about 50 nm.

Figure 6:
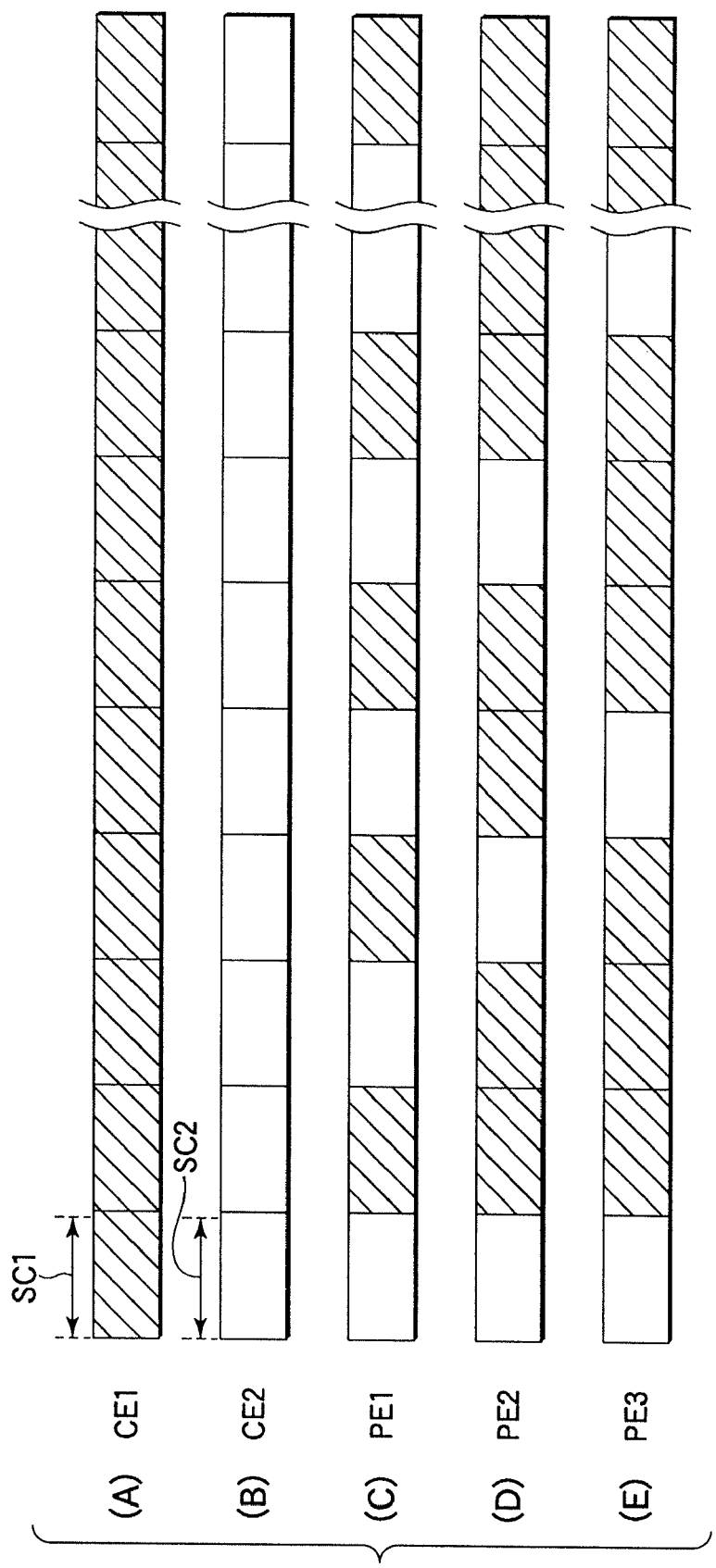
FIG. 6 is a diagram showing combinations of cycle sets performed with plasma and cycle sets performed without plasma, according to present examples and comparative examples used in an experiment.

FIG. 6 is a diagram showing combinations of cycle sets performed with plasma and cycle sets performed without plasma, according to the present examples and comparative examples used in the experiment. In FIG. 6, a shaded zone represents a first cycle set SC1 utilizing plasma in the third step ($NH_3$ supply step) T3, while a blank zone represents a second cycle set SC2 utilizing no plasma in the third step ($NH_3$ supply step) T3. In this experiment, one cycle set was formed of one cycle.

As shown in FIG. 6, (A) the comparative example CE1 was arranged such that all the cycle sets were the first cycle set SC1 utilizing plasma. (B) The comparative example CE2 was arranged such that all the cycle sets were the second cycle set SC2 utilizing no plasma. (C) The present example PE1 was arranged such that the first cycle set SC1 utilizing plasma and the second cycle set SC2 utilizing no plasma were alternately performed in the ratio of one to one. The flow chart shown in FIG. 3 corresponds to the present example PE1, although the number of cycles constituting one cycle set is different. (D) The present example PE2 was arranged such that the first cycle set SC1 utilizing plasma and the second cycle set SC2 utilizing no plasma were alternately performed in the ratio of two to one. (E) The present example PE3 was arranged such that the first cycle set SC1 utilizing plasma and the second cycle set SC2 utilizing no plasma were alternately performed in the ratio of three to one.

The number of generated particles per wafer was measured on each of silicon nitride films formed by the present examples and comparative examples shown in FIG. 6. In this experiment, the same film formation apparatus was used to sequentially perform film formation processes in accordance with the comparative example CE1, comparative example CE2, present example PE1, present example PE2, and present example PE3, in this order. The size of particles to be measured was set to fall within a range of 0.08 to 1.00 μm. Wafers placed at TOP (top), CTR (center), and BTM (bottom) of the wafer boat 12 were used as measurement wafers.

Figure 7:
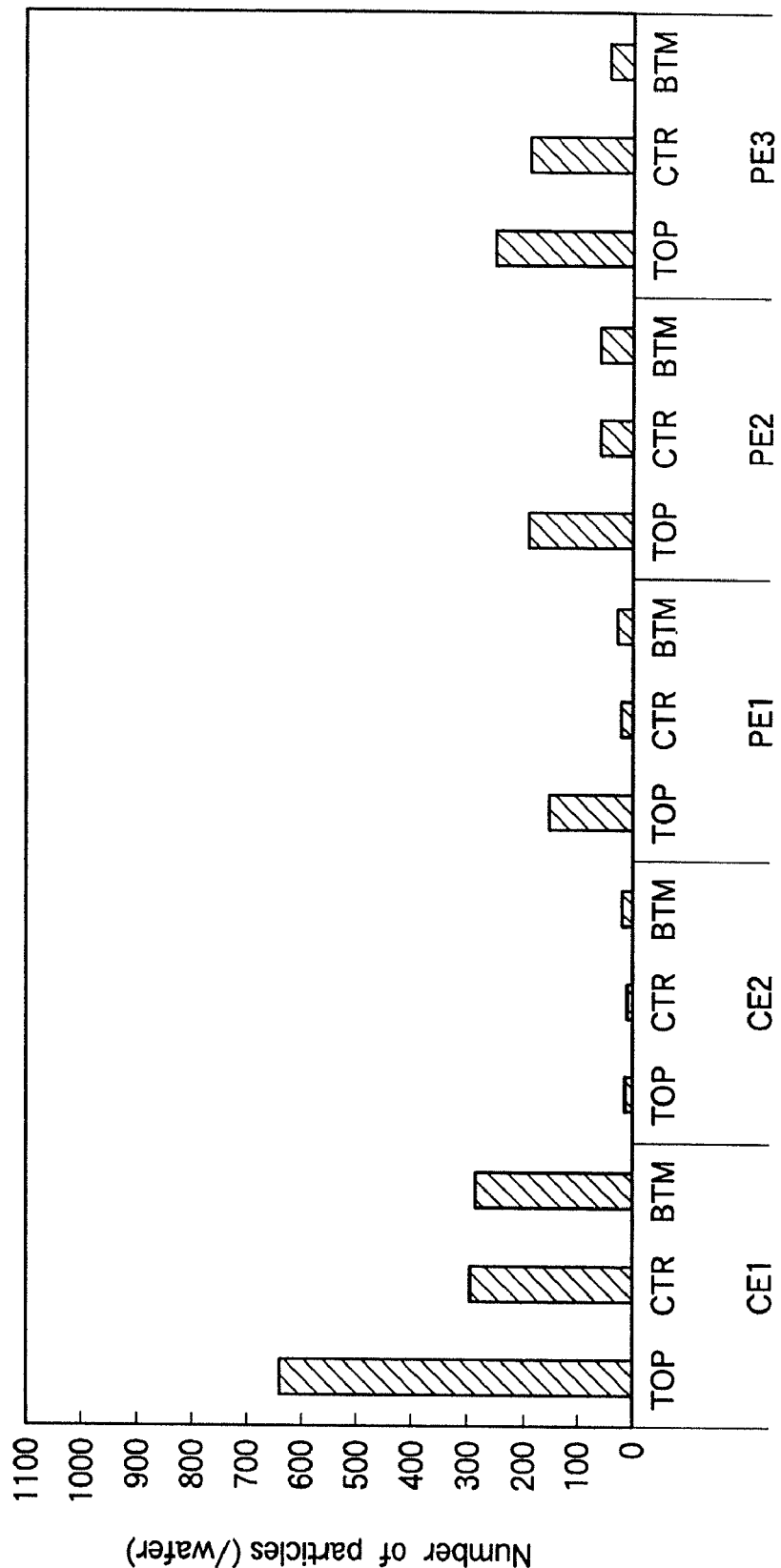
FIG. 7 is a graph showing particle generation, in association with silicon nitride films formed by the present examples and comparative examples shown in FIG. 6.

FIG. 7 is a graph showing particle generation, in association with silicon nitride films formed by the present examples and comparative examples shown in FIG. 6. As shown in FIG. 7, the comparative example CE1 unfavorably rendered a lot of particle generation with the number of particles of 300 or more over the entire positions of the wafer boat. However, the comparative example CE1 provided the silicon nitride film with fairly good film quality. The comparative example CE2 rendered a very good result with the number of particles of about 10 to 20 over the entire positions of the wafer boat. However, the comparative example CE2 did not provide the silicon nitride film with good film quality.

On the other hand, the present examples PE1 to PE3 rendered the number of particles gradually increased with an increase in the ratio of use of plasma in the third step ($NH_3$ supply step) T3. However, the number of particles was favorably still far lower than that of the comparative example CE1. Further, the present examples PE1 to PE3 provided the silicon nitride film with relatively good film quality.

Then, the stress of silicon nitride films formed by the present examples and comparative examples shown in FIG. 6 was measured. If this film stress is larger, the silicon nitride film can be easily cracked and peeled, so particle generation may be developed. Wafers placed at TOP (top) and BTM (bottom) of the wafer boat 12 were used as measurement wafers.

Figure 8:
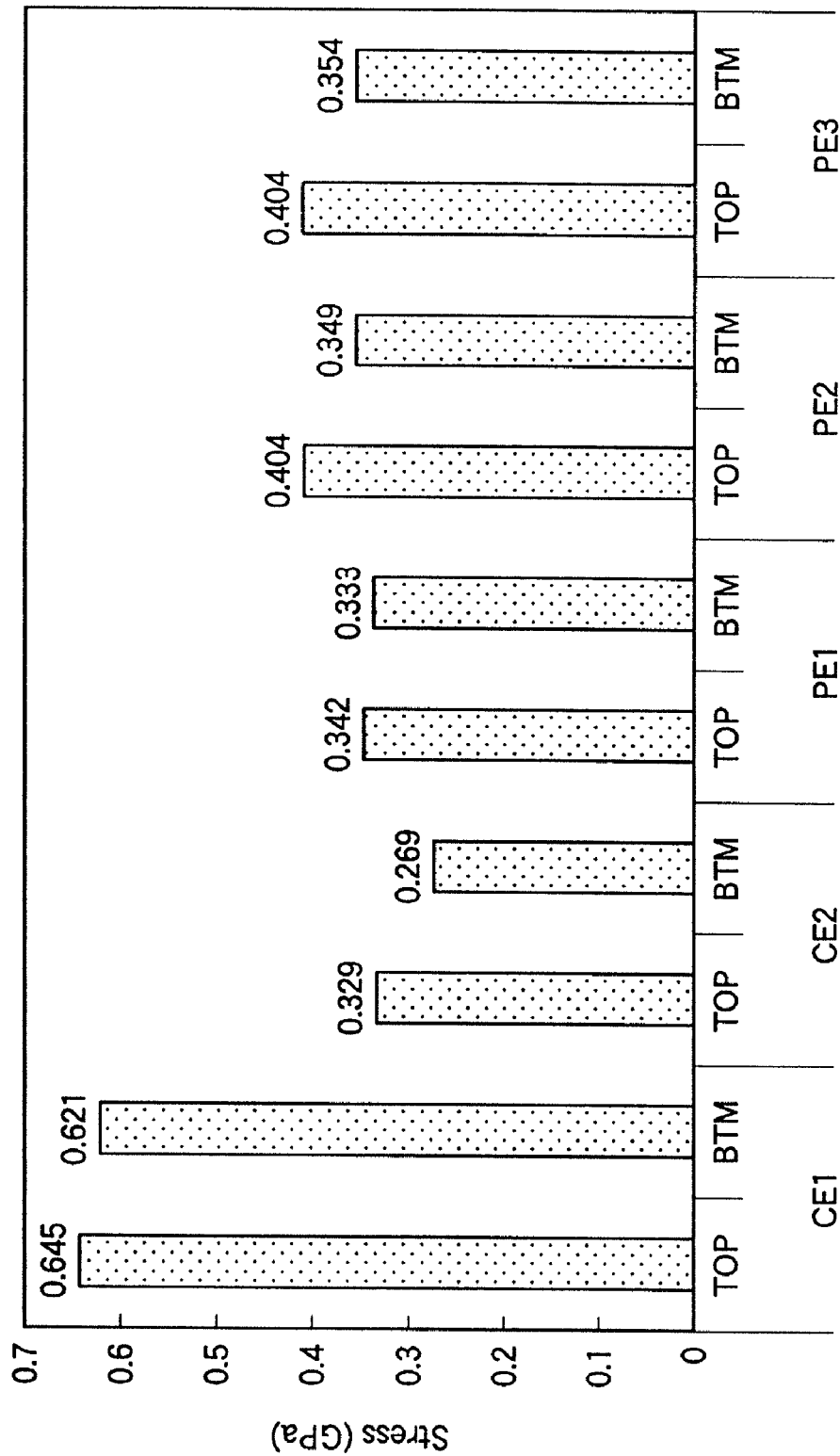
FIG. 8 is a graph showing the stress of silicon nitride films formed by the present examples and comparative examples shown in FIG. 6.

FIG. 8 is a graph showing the stress of silicon nitride films formed by the present examples and comparative examples shown in FIG. 6. As shown in FIG. 8, the comparative example CE1 rendered a film stress of about 0.621 GPa, which was far higher than those of the comparative example CE2 and present examples PE1 to PE3. It is thought that such a high film stress of the comparative example CE1 was one of the causes that brought about a large number of generated particles in the comparative example CE1, as described with reference to FIG. 7.

The film stress was lowest in the comparative example CE, and gradually increased with an increase in the ratio of use of plasma in the third step ($NH_3$ supply step) T3. However, the maximum was 0.404 GPa in the present example PE3, which was still far lower than that of the comparative example CE1. It is thought that such a low film stress was one of the causes that brought about a small number of generated particles in the comparative example CE2 and present examples PE1 to PE3, as described with reference to FIG. 7. Further, by adjusting the ratio of use of plasma in the third step ($NH_3$ supply step) T3, the film stress was controlled.

Then, silicon nitride films formed by the present examples and comparative examples shown in FIG. 6 were examined in terms of the film formation rate and the inter-substrate uniformity and planar uniformity of the film thickness. Wafers placed at TOP (top), CTR (center), and BTM (bottom) of the wafer boat 12 were used as measurement wafers.

Figure 9:
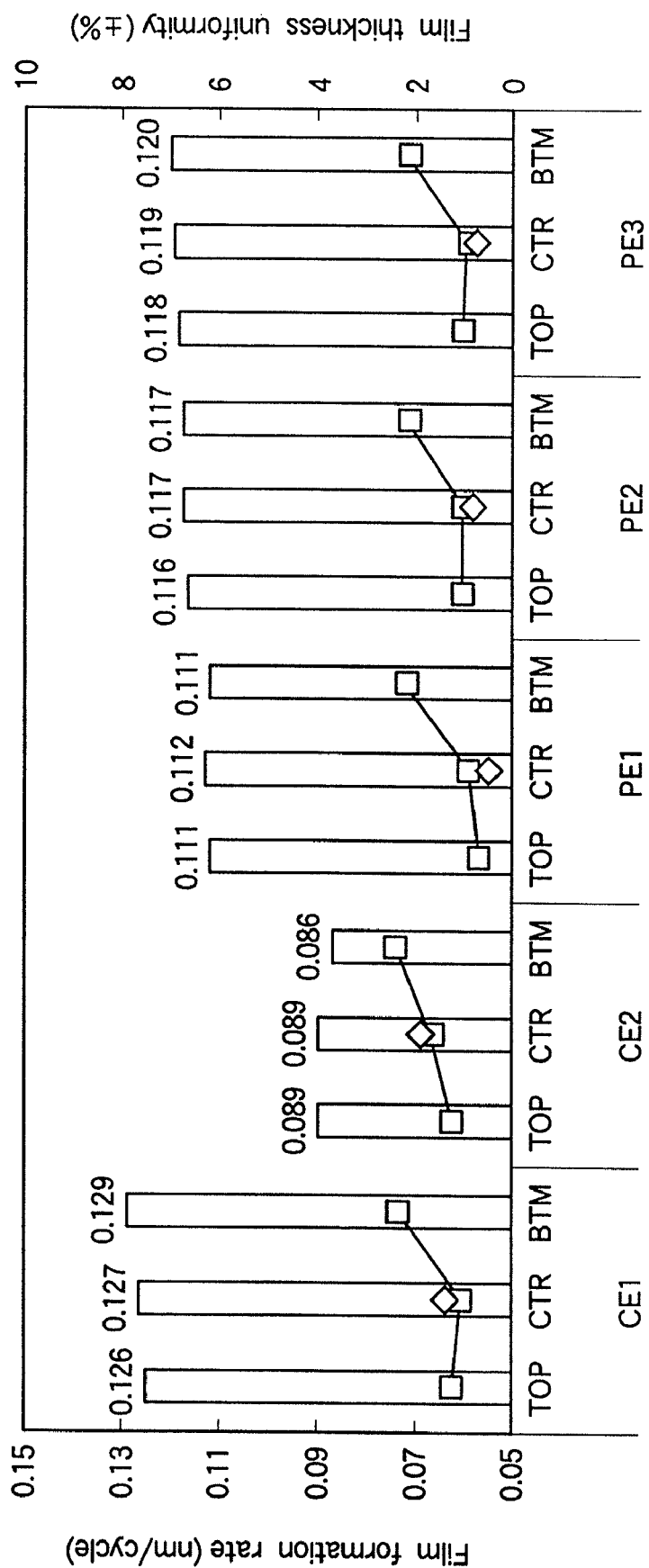
FIG. 9 is a graph showing the film formation rate and the inter-substrate uniformity and planar uniformity of the film thickness, in association with silicon nitride films formed by the present examples and comparative examples shown in FIG. 6.

FIG. 9 is a graph showing the film formation rate and the inter-substrate uniformity and planar uniformity of the film thickness, in association with silicon nitride films formed by the present examples and comparative examples shown in FIG. 6. In FIG. 9, bars denote film formation rates, lines provided with symbols "□" denote the planar uniformity of the film thickness, and points defined by symbols "◇" denote the inter-substrate uniformity of the film thickness.

As shown in FIG. 9, the comparative example CE1 rendered a high film formation rate of about 0.126 nm/cycle due to the presence of plasma. The comparative example CE2 rendered a low film formation rate of about 0.089 nm/cycle due to the absence of plasma. On the other hand, the present examples PE1 to PE3 rendered film formation rates lower than that of the comparative example CE1 but favorably far higher than that of the comparative example CE2. Specifically, the film formation rates were gradually higher with an increase in the ratio of use of plasma in the third step ($NH_3$ supply step) T3, such that the present example PE1 resulted in about 0.111 nm/cycle, and the present example PE3 resulted in about 0.119 nm/cycle.

As regards the planar uniformity of the film thickness, it differed depending on the positions TOP, CTR, and BTM, but the present examples PE1 to PE3 brought about relatively good results with the same tendency, as compared to the comparative example CE2. As regards the inter-substrate uniformity of the film thickness, the comparative examples CE1 and CE2 showed values of less than ±2%, while the present examples PE1 to PE3 favorably showed values of less than ±1%.

Then, the etching rate of silicon nitride films formed by the present examples and comparative examples shown in FIG. 6 was measured. As an etching liquid, 0.5% dilute hydrofluoric acid (0.5%-DHF) was used. Wafers placed at TOP (top), CTR (center), and BTM (bottom) of the wafer boat 12 were used as measurement wafers, but only one wafer placed at CTR (center) was used in the comparative example CE1.

Figure 10:
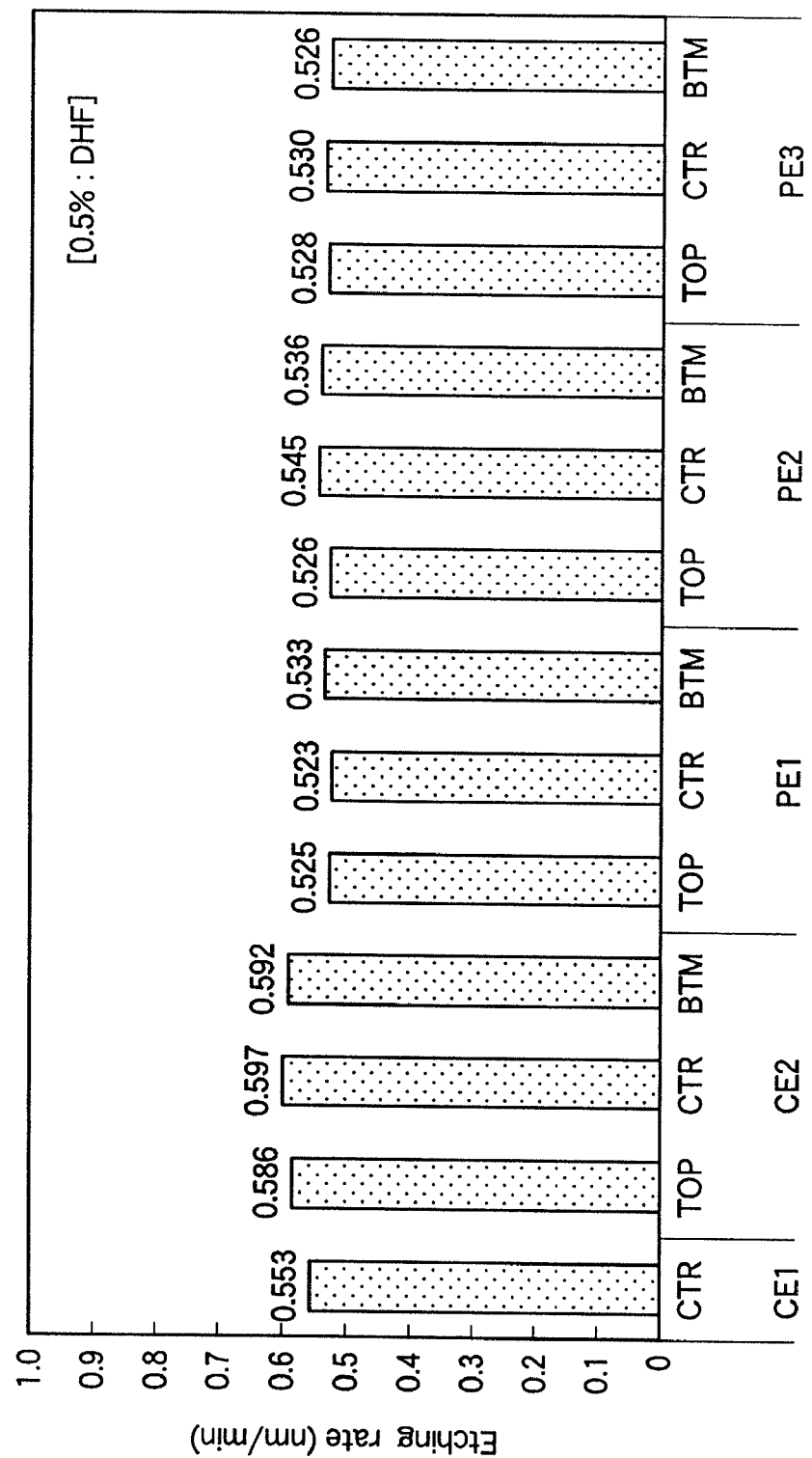
FIG. 10 is a graph showing the etching rate of silicon nitride films formed by the present examples and comparative examples shown in FIG. 6.

FIG. 10 is a graph showing the etching rate of silicon nitride films formed by the present examples and comparative examples shown in FIG. 6. As shown in FIG. 10, the comparative example CE2 rendered a relatively large etching rate of about 0.592 nm/min. On the other hand, the present examples PE1 to PE3 rendered etching rates of about 0.525 to 0.545 nm/min, which were smaller than that of the comparative example CE2 and were closer to 0.553 nm/min of the comparative example CE1 that provided the film with high quality. Hence, it was confirmed that the present examples PE1 to PE3 brought about good characteristics with low etching rates.

<Pre-coating Process>

In the film formation method according to the embodiment of the present invention, before a silicon nitride film is formed on target substrates or product semiconductor wafers W by the film formation process described above, a pre-coating process may be performed to form a pre-coating film inside the process container 4. In the pre-coating process, the wafer boat 12 set in an empty state with no wafers held thereon, or a state with dummy wafers held thereon in place of product semiconductor wafers W, is placed in the process field 5. As regards gas supply, the pre-coating process is arranged to repeat a number of times a cycle comprising the first to fourth steps T1 to T4 shown in FIG. 3, as in the film formation process. Consequently, thin films of silicon nitride formed by respective cycles are laminated, thereby arriving at a pre-coating film of silicon nitride having a target thickness.

Specifically, the first step T1 is arranged to perform supply of the first process gas (denoted as DCS in FIG. 3) into the process container 4, while maintaining the shut-off state of supply of the second process gas (denoted as $NH_3$ in FIG. 3) into the process container 4. The second step T2 is arranged to maintain the shut-off state of supply of the first and second process gases into the process container 4. The third step T3 is arranged to perform supply of the second process gas into the process container 4, while maintaining the shut-off state of supply of the first process gas into the process container 4. The fourth step T4 is arranged to maintain the shut-off state of supply of the first and second process gases into the process container 4. Each of the second and fourth steps T2 and T4 is used as a purge step to remove the residual gas within the process container 4.

However, in the third step T3 of the pre-coating process, the RF power supply 76 is always set in the OFF-state not to turn the second process gas into plasma by the gas exciting section 66, while supplying the second process gas into the process container 4. In other words, the second cycle set SC2 utilizing no plasma is repeated to form a pre-coating film inside the process container 4. The other process conditions of the pre-coating process, such as the process pressure and process temperature, are set to be the same as the process conditions of the film formation process described above.

With the pre-coating process, the surface of components inside the process container 4, such as the inner wall of the process container 4 and the wafer boat 12, are covered with a pre-coating film of silicon nitride formed by use of no plasma. After the pre-coating film is formed, the wafer boat 12 is unloaded from the process container 4. Then, product wafers W to be subjected to the film formation process are transferred onto this wafer boat 12 within the loading area (not shown), and the film formation process is subsequently performed in the manner described above.

Where the pre-coating process described above is combined with the film formation process, it is possible to minimize particle generation due to by-product films deposited on the inner surface of the process container 4. Consequently, the film quality of a silicon nitride film formed on wafers W by the film formation process is further improved. It was confirmed that, even where only the first cycle set SC1 utilizing plasma was repeated in the film formation process after the pre-coating process, particle generation was decreased.

<Other Modifications>

In the embodiment described above, for example, the exciting section 66 for generating plasma of the film formation apparatus 2 is integrally combined with the process container 4. Alternatively, the exciting section 66 may be separately disposed from the process container 4, so as to excite $NH_3$ gas outside the process container 4 (so called remote plasma), and then supply the excited $NH_3$ gas into the process container 4.

In the embodiment described above, for example, the first process gas contains DCS gas as a silane family gas. In this respect, the silane family gas may contain at least one gas selected from the group consisting of dichlorosilane (DCS), hexachlorodisilane (HCD), monosilane ($SiH_4$), disilane ($Si_2Cl_6$), hexamethyl-disilazane (HMDS), tetrachlorosilane (TCS), disilylamine (DSA), trisilylamine (TSA), bistertial-butylaminosilane (BTBAS), trimethylsilane (TMS), dimethylsilane (DMS), and monomethylamine (MMA).

In the embodiment described above, for example, the second process gas contains $NH_3$ gas as a nitriding gas. In this respect, the nitriding gas may contain at least one gas selected from the group consisting of ammonia ($NH_3$), nitrogen ($N_2$), dinitrogen oxide ($N_2O$), and nitrogen oxide (NO).

In the embodiment described above, a silicon nitride film to be formed may be provided with components, such as boron (B) and/or carbon (C). In this case, each cycle of the film formation process further comprises a step or steps of supplying a doping gas and/or a carbon hydride gas. A boron-containing gas used for doping boron may contain at least one gas selected from the group consisting of $BCl_3$, $B_2H_6$, $BF_3$, and $B(CH_3)_3$. A carbon hydride gas used for adding carbon may contain at least one gas selected from the group consisting of acetylene, ethylene, methane, ethane, propane, and butane.

A target substrate is not limited to a semiconductor wafer, and it may be another substrate, such as an LCD substrate or glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for using a film formation apparatus to form a silicon nitride film by CVD on a plurality of target substrates while suppressing particle generation, the apparatus comprising a process container having a vertically elongated process field configured to accommodate the target substrates, a support member configured to support the target substrates at intervals in a vertical direction inside the process field, an exciting mechanism attached on a sidewall of the process container and including a plasma generation area communicating with the process field and an electrode extending along the plasma generation area and configured to be supplied with a radio frequency power, the plasma generation area being present in a recess formed on the process container and extending over a vertical length corresponding to the process field, a process gas supply system configured to selectively supply a silicon source gas and nitriding gas into the process field, such that the silicon source gas is supplied into the process field not through the plasma generation area and the nitriding gas is supplied into the process field through the plasma generation area, and the silicon source gas and the nitriding gas are supplied to form essentially horizontal gas flows in the process field over a length corresponding to the process field in a vertical direction, and an exhaust system configured to exhaust gas from inside the process container through an exhaust passage connected to the process container, the method comprising:

conducting a pre-coating process by performing a plurality of pre-cycles in the process container, with the support member placed in the process field and set in an empty state or with dummy substrates supported thereon in place of the target substrates, to form a pre-coating film on an inner surface of the process container and on a surface of the support member, each of the pre-cycles including a first pre-supply step of supplying the silicon source gas into the process container without supplying the nitriding gas into the process container, then a first pre-purge step of exhausting gas from inside the process container without supplying the silicon source gas and the nitriding gas into the process container, then a second pre-supply step of supplying the nitriding gas into the process container without supplying the silicon source gas into the process container, and then a second pre-purge step of exhausting gas from inside the process container without supplying the silicon source gas and the nitriding gas into the process container, wherein the second pre-supply step comprises no period of exciting the nitriding gas by the exciting mechanism; and after the pre-coating process is finished, conducting a film formation process by performing a plurality of main cycles in the process container, with the support member placed in the process field and set with the target substrates supported thereon, to laminate thin films respectively formed by the main cycles on the target substrates, thereby forming a silicon nitride film with a predetermined thickness, each of the main cycles including a first supply step of supplying the silicon source gas into the process container without supplying the nitriding gas into the process container, then a first purge step of exhausting gas from inside the process container without supplying the silicon source gas and the nitriding gas into the process container, then a second supply step of supplying the nitriding gas into process container without supplying the silicon source gas into the process container, and then a second purge step of exhausting gas from inside the process container without supplying the silicon source gas and the nitriding gas into the process container, wherein the film formation process repeats a first cycle set and a second cycle set mixedly a plurality of times without an essential change in a heating temperature set to the process field, the first cycle set being composed of a main cycle or main cycles in which the second supply step includes an excitation period of supplying the nitriding gas while exciting the nitriding gas by the exciting mechanism, and the second cycle set being composed of a main cycle or main cycles in which the second supply step includes no period of exciting the nitriding gas by the exciting mechanism, wherein the pre-coating process and the film formation process are combined to suppress particle generation due to by-product films deposited inside the process container, by use of collaboration of film stress reduction provided by the second cycle set of the film formation process with the pre-coating film on the inner surface of the process container and on the surface of the support member.

2. The method according to claim 1, wherein the film formation process repeats the first cycle set and the second cycle set alternately a plurality of times.

3. The method according to claim 1, wherein the first cycle set is formed of a plurality of main cycles.

4. The method according to claim 3, wherein the number of main cycles forming the first cycle set is larger than the number of main cycles forming the second cycle set.

5. The method according to claim 1, wherein the film formation process repeats the first cycle set and the second cycle set alternately a plurality of times, and the number of main cycles forming the first cycle set is 3 or more while the number of main cycles forming the second cycle set is one.

6. The method according to claim 1, wherein each of the main cycles continuously exhausts gas from inside the process container through the first supply step, the first purge step, the second supply step, and the second purge step.

7. The method according to claim 1, wherein each of the first and second purge steps includes a period of supplying a purge gas into the process container.

8. The method according to claim 1, wherein the second supply step of the first cycle set further comprises a period of supplying the nitriding gas while not exciting the nitriding gas by the exciting mechanism, before the excitation period.

9. The method according to claim 1, wherein each of the first and second supply steps sets the process field at a temperature of 300 to 700° C.

10. The method according to claim 1, wherein each of the first and second supply steps sets the process field at a pressure of 13 Pa to 13,300 Pa.

11. The method according to claim 1, wherein the silicon source gas contains a gas selected from the group consisting of dichlorosilane, hexachlorodisilane, monosilane, disilane, hexamethyldisilazane, tetrachlorosilane, disilylamine, trisilylamine, and bistertialbutylaminosilane, trimethylsilane, dimethylsilane, and monomethylamine, and the nitriding gas contains a gas selected from the group consisting of ammonia, dinitrogen oxide, and nitrogen oxide.

12. The method according to claim 11, wherein each of the main cycles of the film formation process further includes a step or steps of supplying at least one gas selected from the group consisting of a doping gas and a carbon hydride gas.

13. The method according to claim 1, wherein the pre-coating process uses the same process temperature as the film formation process.

14. The method according to claim 1, wherein in the pre-coating process, the support member is set with dummy substrates supported thereon in place of the target substrates.

15. The method according to claim 1, wherein the exhaust system includes an exhaust port formed on the process container at a position opposite to the plasma generation area, with the process filed interposed therebetween, and connected to the exhaust passage.

16. The method according to claim 1, wherein the apparatus further comprises a control section configured to control an operation of the apparatus and including a computer readable non-transitory medium containing program instructions for execution on a processor, such that the program instructions, when executed by the processor, control the apparatus to conduct the pre-coating process and the film formation process in accordance with the method.

* * * * *

UNITED STATES PATENT AND TRADEMARK OFFICE
CERTIFICATE OF CORRECTION

| | |
|---|---|
| PATENT NO. | : 8,178,448 B2 |
| APPLICATION NO. | : 12/852094 |
| DATED | : May 15, 2012 |
| INVENTOR(S) | : Nobutake Nodera et al. |

It is certified that error appears in the above-identified patent and that said Letters Patent is hereby corrected as shown below:

Title Page

Item (75), Inventor, correct the fourth listed inventor's name from "Koto Umezawa" to --Kota Umezawa--.

Signed and Sealed this
Twenty-first Day of August, 2012

David J. Kappos
*Director of the United States Patent and Trademark Office*